(12) United States Patent
Briggs et al.

(10) Patent No.: US 11,456,573 B2
(45) Date of Patent: Sep. 27, 2022

(54) TAPERED-GRATING SINGLE MODE LASERS AND METHOD OF MANUFACTURING

(71) Applicant: California Institute of Technology, Pasadena, CA (US)

(72) Inventors: Ryan M. Briggs, Pasadena, CA (US); Clifford F. Frez, Pasadena, CA (US); Mathieu Fradet, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 23 days.

(21) Appl. No.: 17/061,020

(22) Filed: Oct. 1, 2020

(65) Prior Publication Data
US 2021/0104869 A1   Apr. 8, 2021

Related U.S. Application Data

(60) Provisional application No. 62/909,382, filed on Oct. 2, 2019.

(51) Int. Cl.
*H01S 3/08* (2006.01)
*H01S 5/12* (2021.01)
(Continued)

(52) U.S. Cl.
CPC .......... *H01S 5/1237* (2013.01); *H01S 5/1014* (2013.01); *H01S 5/1225* (2013.01);
(Continued)

(58) Field of Classification Search
CPC .. H01S 5/1237; H01S 5/1014; H01S 5/34313; H01S 5/1064; H01S 5/1225; H01S 2301/163
See application file for complete search history.

(56) References Cited

U.S. PATENT DOCUMENTS 5,953,356 A   9/1999   Botez et al.
6,204,078 B1  3/2001   Inomoto
(Continued)

OTHER PUBLICATIONS

Arbabi et al., "Efficient dielectric metasurface collimating lenses for mid-infrared quantum cascade lasers", Optics Express, vol. 23, No. 26, Dec. 28, 2015, pp. 33310-33317, https://doi.org/10.1364/OE.23.033310.
(Continued)

*Primary Examiner* — Kinam Park
(74) *Attorney, Agent, or Firm* — KPPB LLP

(57) ABSTRACT

Single-mode distributed-feedback (DFB) lasers including single mode DFB waveguides with tapered grating structures are provided herein. Tapered grating structures provide for single mode DFB waveguides with predictable single mode operation. Uniform grating structures may provide for single mode operation, however DFB waveguides implementing uniform grating structures may operate at one of two single modes. Advantageously, DFB waveguides with tapered gratings operate with a spectrally narrow single mode at the same predictable single mode for all DFB waveguides with substantially identical specifications. Such predictability may lead to increased yield during manufacture of DFB waveguides with tapered gratings.

19 Claims, 9 Drawing Sheets

(51) Int. Cl.
 *H01S 5/343* (2006.01)
 *H01S 5/10* (2021.01)
(52) U.S. Cl.
 CPC ........ *H01S 5/34313* (2013.01); *H01S 5/1064* (2013.01); *H01S 2301/163* (2013.01)

(56) References Cited

U.S. PATENT DOCUMENTS

| | | | |
|---|---|---|---|
| 6,326,646 | B1 | 12/2001 | Baillargeon et al. |
| 7,408,966 | B2 | 8/2008 | Botez et al. |
| 7,738,523 | B2* | 6/2010 | Hatori ................. H01S 5/12 372/45.01 |
| 9,350,138 | B2* | 5/2016 | Gubenko ............... H01S 5/221 |
| 9,438,011 | B2 | 9/2016 | Frez et al. |
| 9,819,151 | B2* | 11/2017 | Santis ................. H01S 5/3013 |
| 9,933,554 | B2* | 4/2018 | Santis ................. H01S 5/2231 |
| 9,991,677 | B2* | 6/2018 | Briggs ................. H01S 5/22 |
| 10,020,636 | B2* | 7/2018 | Zheng ................ H01S 5/06258 |
| 2004/0037503 | A1* | 2/2004 | Hastings ............... G02B 6/124 385/37 |
| 2007/0248134 | A1 | 10/2007 | Hatori et al. |
| 2012/0106583 | A1* | 5/2012 | Watson ............... H01S 5/22 438/32 |
| 2013/0221223 | A1 | 8/2013 | Caneau et al. |
| 2013/0287054 | A1 | 10/2013 | Kwon et al. |
| 2014/0355637 | A1 | 12/2014 | Hashimoto et al. |
| 2015/0333482 | A1 | 11/2015 | Briggs |
| 2016/0049770 | A1 | 2/2016 | Frez et al. |
| 2016/0380407 | A1* | 12/2016 | Sysak ................. H01S 5/3013 398/214 |
| 2017/0170631 | A1* | 6/2017 | Chimot ............... H01S 5/06258 |
| 2018/0323580 | A1* | 11/2018 | Xie .................... H01S 5/028 |

OTHER PUBLICATIONS

Bismuto et al., "High performance, low dissipation quantum cascade lasers across the mid-IR range", Optics Express, vol. 23, No. 5, Mar. 9, 2015, pp. 5477-5484, https://doi.org/10.1364/OE.23.005477.
Briggs et al., "Regrowth-free single-mode quantum cascade lasers with power consumption below 1 W", Applied Physics Letters, Vo. 105, No. 14, Oct. 10, 2014, pp. 141117, https://doi.org/10.1063/1.4898003.
Hinkov et al., "Singlemode quantum cascade lasers with power dissipation below 1 W", Electronics Letters, vol. 48, No. 11, May 24, 2012, pp. 646-647, DOI: 10.1049/el.2012.1204.
Kang et al., "Quantum cascade lasers with Y2O3 insulation layer operating at 8.1 μm", Optics Express, vol. 25, No. 16, Aug. 7, 2017, pp. 19561-19567, https://doi.org/10.1364/OE.25.019561.
Liu et al., "Coupled-Resonator Optical Waveguides (CROWs) Based on Tapered Grating-Defect Resonators", Conference on Lasers and Electro-Optics 2012, OSA Technical Digest (online) (Optica Publishing Group, 2012), 2012, paperCM3M.3, 2 pgs., https://opg.optica.org/abstract.cfm?URI=CLEO_SI-2012-CM3M.3.
Liu et al., "Designing coupled-resonator optical waveguides based on high-Q tapered grating-defect resonators", Optics Express, vol. 20, No. 8, Apr. 9, 2012, pp. 9249-9263, https://doi.org/10.1364/OE.20.009249.
Myers et al., "Qualification of quantum cascade lasers for space environments", Proceedings SPIE 9113, Sensors for Extreme Harsh Environments, Jun. 5, 2014, 91130Q, https://doi.org/10.1117/12.2053335.
Santis, "High-Coherence Hybrid Si/III-V Semiconductor Lasers", California Institute of Technology, Thesis, May 24, 2013, 194 pgs.
Santis et al., "High-coherence semiconductor lasers based on integral high-Q resonators in hybrid Si/III-V platforms", PNAS, vol. 111, No. 8, Feb. 25, 2014, pp. 2879-2884, https://doi.org/10.1073/pnas.1400184111.
Webster et al., "Isotope Ratios of H, C, and O in CO2 and H2O of the Martian Atmosphere", Science, vol. 341, No. 6143, Jul. 19, 2013, pp. 260-263, DOI: 10.1126/science.12379.

Webster et al., "Mars Methane Detection and Variability at Gale Crater", Science, Jan. 23, 2015, vol. 347, pp. 415-417.
Zhang et al., "High-performance uncooled distributed-feedback quantum cascade laser without lateral regrowth", Applied Physics Letters, vol. 100, No. 11, Mar. 13, 2012, pp. 112105-1-112105-4, https://doi.org/10.1063/1.3693425.
Briggs et al., "Single-mode 2.65 um InGaAsSb/AlInGaAsSb laterally coupled distributed-feedback diode lasers for atmospheric gas detection", Opt. Express, Jan. 11, 2013, vol. 21, pp. 1317-1323.
Canedy et al., "High-power, narrow-ridge, mid-infrared interband cascade Tasers", Journal of Crystal Growth, Jan. 9, 2007, vol. 301-302, pp. 931-934.
Canedy et al., "High-power, narrow-ridge, mid-infrared interband cascade Tasers", Journal of Vacuum Science & Technology, May/Jun. 2008, B26, pp. 1160-1162.
Choi et al., "Evaluation of coupling Coefficients for Laterally-Coupled Distributed Feedback Lasers", Jpn. J. Appl. Phys., Sep. 1996, vol. 35, pp. 4654-4659.
Evans et al., "Buried heterostructure quantum cascade lasers with high continuous-wave wall plug efficiency", Applied Physics Letters, 2007, vol. 91, pp. 071101-1-071101-3.
Faist et al., "Distributed feedback quantum cascade lasers", Appl. Phys. Lett., May 19, 1997, vol. 70, No. 20, pp. 2670-2672.
Farquar et al., "Atmospheric Influence of Earth's Earliest Sulfur Cycle", Science, Aug. 4, 2000, vol. 289, Issue 5480, pp. 756-758, DOI: 10.1126/science.289.5480.756.
Forouhar et al., "High-power laterally coupled distributed-feedback GaSb-based diode lasers at 2um wavelength", Applied Physics Letters, Jan. 19, 2012, vol. 100, p. 031107-1-031107-4.
Forouhar et al., "Reliable mid-infrared laterally-coupled distributed-feedback interband cascade layers", Applied Physics Letter, Aug. 4, 2014, vol. 105, 4 pgs.
Gmachl et al., "Continuous-wave and high-power pulsed operation of index-coupled distributed feedback quantum cascade laser at λ ≈ 8.5 μm", Applied Physics Letters, Mar. 23, 1998, vol. 72, No. 1, pp. 1430-1432.
Golka et al., "Quantum cascade lasers with lateral double-sided distributed feedback grating", Applied Physics Letters, vol. 86, Mar. 7, 2005, pp. 111103-1-111103-3.
Gupta et al., "Modal Gain of 2.4-um InGaAsSb-AlGaAsSb Complex-Coupled Distributed-Feedback Lasers", IEEE Photonics Technology Letters, Oct. 15, 2009, vol. 21, No. 20, pp. 1532-1534.
Gupta et al., "Single mode 2.4 um InGaAsSb/AlGaAsSb distributed feedback lasers for gas sensing", Applied Physics Letter, Jul. 27, 2009, vol. 95, pp. 041104-1-041104-3.
Hinkov et al., "Singlemode quantum cascade lasers with power dissipation below 1 W", Electronics Letters, May 24, 2012, vol. 48, No. 11, 2 pgs.
Keil et al., "Oxide Dual Damascene Trench Etch Profile Control", Journal of The Electrochemical Society, Jun. 5, 2001, vol. 148, No. 7, pp. G383-G388.
Kim et al., "Corrugated-sidewall interband cascade lasers with single-mode midwave-infrared emission at room temperature", Applied Physics Letters, Decembers, 2009, vol. 95, pp. 231103-1-231103-4.
Kim et al., "Mid-infrared distributed-feedback interband cascade lasers with continuous-wave single-mode emission to 80 degrees C", Applied Physics Letter, Aug. 6, 2012, vol. 101, pp. 061104-1-061104-3.
Kosterev et al., "Application of quantum cascade lasers to trace gas analysis", Appl. Phys., 2008, B90, pp. 165-176.
Lehnhardt et al., "Continuous wave single mode operation of GaInAsSb/GaSb quantum well lasers emitting beyond 3 um", Applied Physics Letters, May 8, 2008, vol. 92, pp. 183508-1-183508-3.
Lu et al., "Room-temperature continuous wave operation of distributed feedback quantum cascade lasers with watt-level power output", Applied Physics Letters, 2010, vol. 97, p. 231119-1-31119-3.
Salhi et al., "Single-frequency Sb-based distributed-feedback lasers emitting at 2.3 um above room temperature for application in tunable diode laser absorption spectroscopy", Applied Optics, Jul. 10, 2006, vol. 45, No. 20, pp. 4957-4965.

(56) References Cited

OTHER PUBLICATIONS

Streifer et al., "Coupling Coefficients for Distributed Feedback Single- and Double-Heterostructure Diode Lasers", IEEE Journal of Quantum Electronics, Nov. 1975, vol. QE-11, No. 11, pp. 867-873.
Streifer et al., "Effect of External Reflectors on Longitudinal Modes of Distributed Feedback Lasers", IEEE Journal of Quantum Electronics, Apr. 1975, pp. 154-161.
Streifer et al., "TM-Mode Coupling Coefficients in Guided-Wave Distributed Feedback Lasers", IEEE Journal of Quantum Electronics, Feb. 1976, vol. QE-12, No. 2, pp. 74-78.
Vurgaftman et al., "Rebalancing of internally generated carriers for midinfrared interband cascade lasers with very low power consumption", Nature Communications, Dec. 13, 2011, 7 pgs.
Wienold et al., "Lateral distributed-feedback gratings for single-mode, high-power terahertz quantum-cascade lasers", Opt. Express, May 7, 2012, vol. 20, No. 10, 11207-11217.

* cited by examiner

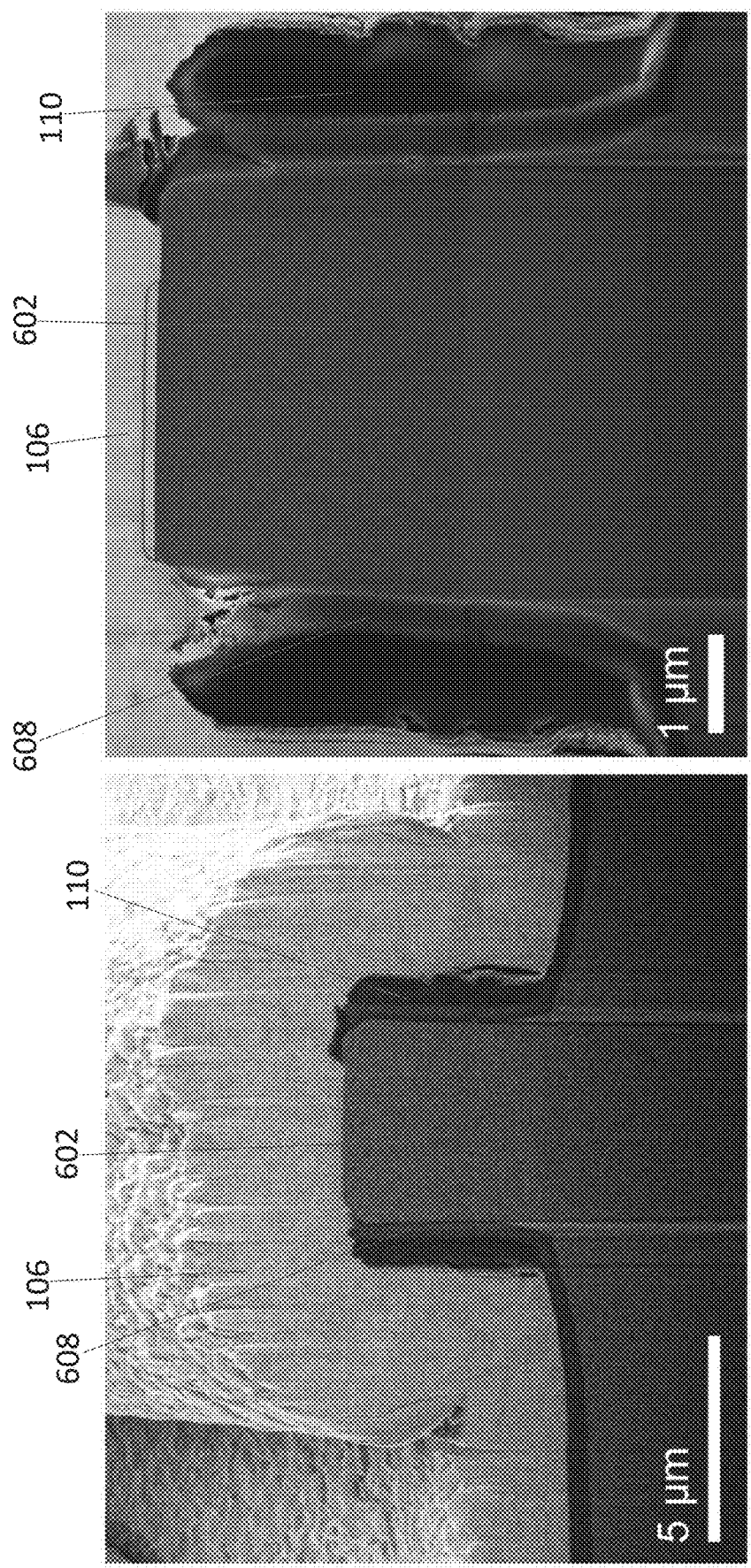

TAPERED-GRATING SINGLE MODE LASERS AND METHOD OF MANUFACTURING

CROSS-REFERENCE TO RELATED APPLICATIONS

This application claims the benefit of and priority under 35 U.S.C. § 119(e) to U.S. Provisional Patent Application Ser. No. 62/909,382 entitled "Tapered-Grating Single-Mode Lasers," filed Oct. 2, 2019, which is incorporated herein by reference in its entirety for all purposes.

STATEMENT OF FEDERAL SUPPORT

This invention was made with government support under Grant No. 80NM0018D004 awarded by NASA (JPL). The government has certain rights in the invention.

FIELD OF THE INVENTION

The present invention generally relates to single mode distributed-feedback lasers with single mode distributed-feedback waveguides including grating structures.

BACKGROUND

Semiconductor lasers emitting at wavelengths from the ultraviolet to the mid-infrared and into the far-infrared/THz regime have been used as sources for spectroscopic characterization of compounds as well as frequency references locked to known spectral features. Single-mode lasers may also be useful in efficiently creating excited states in matter for pump-probe spectroscopy, atomic interactions for clocks, and fluorescence/luminescence experiments. Narrow-linewidth lasers may also be beneficial for metrology, where laser interference may be used to measure small translations, and high coherence to improve spatial resolution. Finally, single-mode lasers may be useful for optical communication transmitters, where narrow laser linewidth enables dense wavelength multiplexing as well as coherent communication schemes, including phase-sensitive and quantum protocols.

In-plane semiconductor lasers may be based on a waveguide geometry that incorporates a gain medium with an optical confinement structure. Single-mode laser operation may include narrow spectral emission without the use of external filtering. One method for achieving single-mode laser operation is designing the optical confinement structure to support only one lateral spatial mode in the cross section of the waveguide. In some aspects, the laser cavity may be formed in the perpendicular (longitudinal) direction by end-facets, where the waveguide is terminated at reflective interfaces (e.g. the cleaved and/or polished edges of a semiconductor chip). In order to achieve significant optical gain in typical semiconductor structures, the waveguide may benefit from being many times longer in the longitudinal direction than the wavelength of light resonating in the laser cavity, which may lead to a free-spectral range (difference in frequency between longitudinal modes) that may be much smaller than the laser wavelength. Broadening of the laser gain spectrum may be characteristic of semiconductor lasers. Broadening may occur due to fundamental homogeneous broadening and inhomogeneous broadening caused by structural variations. The small free-spectral range may lead to multi-longitudinal-mode laser operation despite the single-lateral-mode characteristics of the laser waveguide. It would be beneficial to ensure single-longitudinal-mode characteristics of the laser waveguide.

SUMMARY OF THE INVENTION

Various embodiments are directed to a single mode distributed-feedback (DFB) waveguide including:
a semiconductor active region; and
a semiconductor cap stacked on top of the semiconductor active region, where semiconductor active region and semiconductor cap form a waveguide,
where the waveguide includes a grating structure distributed along a sidewall of the waveguide, where the grating structure protrudes horizontally out of a side of the waveguide,
where the grating structure comprises a tapered grating portion sandwiched between two uniform grating portions,
where each of the uniform grating portions include a plurality of uniform ridges with approximately identical height which laterally protrude from the waveguide, and
where the tapered grating portion includes a plurality of tapered ridges which gradually increase in height from one end to an apex ridge and gradually decrease in height from the apex to the other end.

In various other embodiments, each of the plurality of uniform ridges includes a depth of approximately 400 nm to 600 nm.

In still various other embodiments, the depth of an apex ridge of the plurality of tapered ridges has a depth of about 800 nm to 1000 nm.

In still various other embodiments, the depth of ridge at the ends of the plurality of tapered ridges equals the depth of the uniform ridges.

In still various other embodiments, the uniform grating portions and the tapered grating portion includes an approximately uniform grating period between the sections.

In still various other embodiments, the waveguide has a thickness of about 6 μm to 6.4 μm.

In still various other embodiments, the waveguide has a lateral width of about 5 μm to 5.4 μm at the widest portion of one of the uniform grating portions.

In still various other embodiments, the waveguide includes another grating structure on an opposing sidewall to the sidewall which mirrors the grating structure.

In still various other embodiments, the waveguide includes a surface adjacent to the sidewall including the grating structure including a mirrored surface, where the width of the mirrored surface is positioned at approximately the maximum width of the quantum cascade stack within the uniform grating portion or is positioned at approximately the minimum width of the waveguide within one of the uniform grating portions.

In still various other embodiments, the mirrored surface is positioned at the lowest depth portion of the grating structure within one of the uniform grating portions or is positioned at the highest depth portion of the grating structure within one of the uniform grating portions.

In still various other embodiments, the waveguide comprises a quantum well structure.

In still various other embodiments, a surface adjacent to the sidewall including the grating structure includes a first mirrored surface and where another surface adjacent to the sidewall including the grating structure and opposite to the first mirrored surface includes a second mirrored surface.

In still various other embodiments, each ridge within the grating structure comprise gradually increasing followed by gradually decreasing depth portions.

In still various other embodiments, the semiconductor active region includes InGaAs quantum wells and AlInAs barriers.

In still various other embodiments, the ridges and a body portion of the waveguide share a substantially uniform thickness.

In still various other embodiments, each of the plurality of uniform ridges includes a depth of approximately 400 nm to 600 nm.

Various embodiments are directed to a single mode DFB laser including:
  a semiconductor substrate;
  the single mode DFB waveguide described above on the semiconductor substrate;
  a dielectric layer positioned on a surface of the semiconductor substrate and positioned conformally on the grating structure;
  a metal layer contacting a portion of a top surface of the semiconductor cap.

In various other embodiments, the semiconductor cap and the semiconductor substrate include a same semiconductor material.

In still various other embodiments, the semiconductor cap and the semiconductor substrate further include an n-type or p-type semiconductor material.

In still various other embodiments, the semiconductor cap and the semiconductor substrate further include a compound semiconductor material.

BRIEF DESCRIPTION OF THE DRAWINGS

The description will be more fully understood with reference to the following figures and data graphs, which are presented as various embodiment of the disclosure and should not be construed as a complete recitation of the scope of the disclosure, wherein:

FIGS. 6A and 6B are various cross-sectional SEM images of a single mode laser with a single mode DFB waveguide with a tapered grating structure according to embodiments.

DETAILED DESCRIPTION

Figure 1:
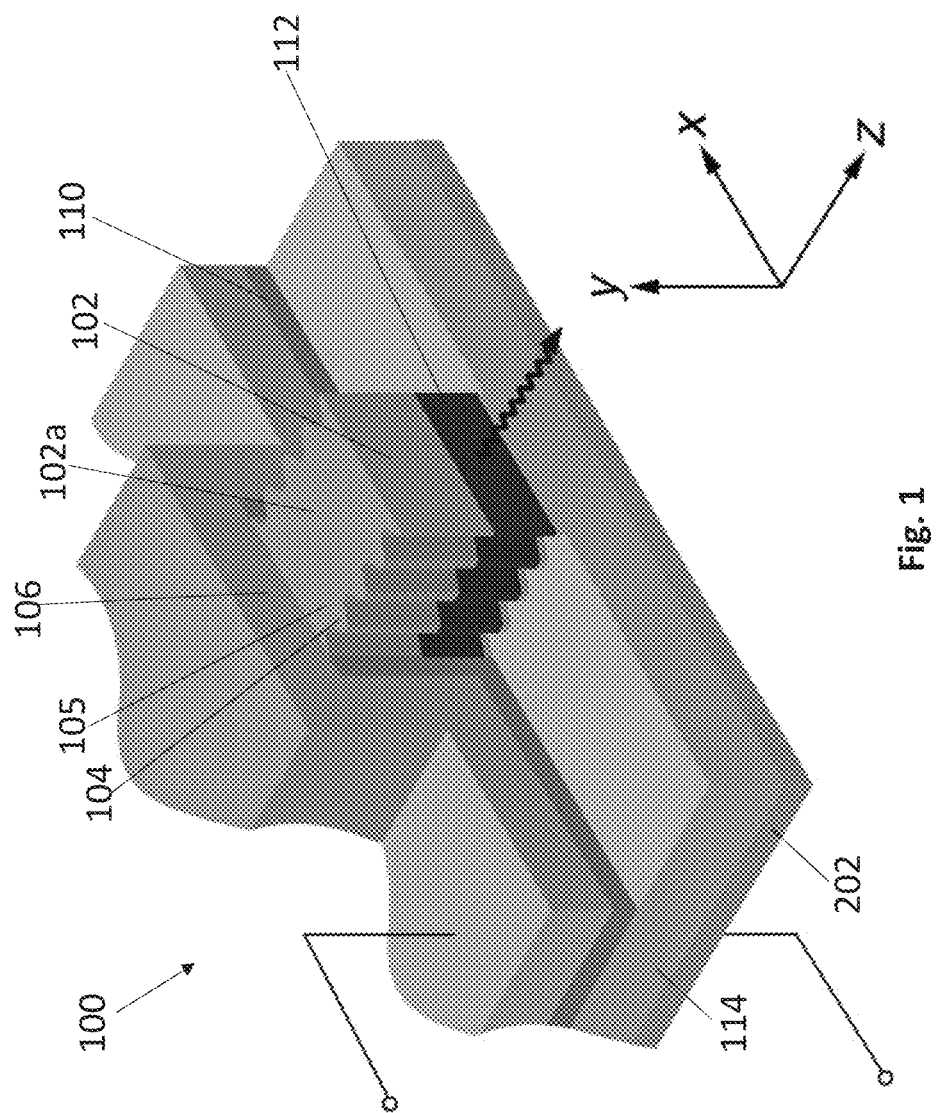
FIG. 1 provides an example single mode distributed-feedback (DFB) laser.

An approach to achieve single-mode characteristics in a laser waveguide is to employ a distributed-feedback (DFB) grating structure in the laser cavity. A DFB grating can allow only a narrow range of frequencies, referred to as a passband, to effectively transmit through the cavity. A passband narrower than the free-spectral range of the laser cavity can lead to single-longitudinal-mode laser operation. However, in the case of an index-coupled DFB laser, where a uniform grating is formed by a periodic variation in the real part of the waveguide refractive index, the laser may operate at two distinct frequencies at the edges of the passband. In practice, DFB lasers with uniform gratings are observed to operate predominately in just one mode, corresponding to one of the two edges of the passband. This is caused by variability in the exact locations of the waveguide end-facets relative to the grating, which leads to better phase matching and higher gain for one mode. Since the grating pitch is comparable to the laser wavelength which is remarkably small, it is practically difficult to control exact location of the cleaved or polished end-facets to within the grating pitch. Consequently, DFB lasers will operate predominately in one mode or the other, and sometimes even hop between modes, depending on stochastic variability from one device to the next. When it is beneficial for the laser wavelength to be exact, which is the case for most applications benefiting from a single-mode laser, this device-to-device variation reduces fabrication yield.

A solution to this issue is to center a defect longitudinally in the DFB grating that shifts the phase of the modes at the edges of the passband in a complementary way such that they have degenerate frequency. While this solution has been successfully employed for near-infrared telecommunication lasers, it also leads to a concentration of the longitudinal energy in the laser cavity at the defect, which leads to unwanted variation in the cavity refractive index and gain, including nonuniform gain saturation (spatial hole burning) at higher laser powers. Even if a DFB laser with a cavity defect operates in a single cavity mode, these index and gain variations lead to instability and spectral broadening, which impacts the utility of the laser for applications benefiting from narrow linewidth.

The present disclosure may be understood by reference to the following detailed description, taken in conjunction with the drawings as described below. It is noted that, for purposes of illustrative clarity, certain elements in various drawings may not be drawn to scale.

Single-mode DFB lasers including single mode DFB waveguides with tapered grating structures are provided herein. In many embodiments tapered grating structures provide for single mode DFB waveguides with predictable single mode operation. Uniform grating structures in various embodiments may provide for single mode operation, however DFB waveguides implementing uniform grating structures may operate at one of two single modes. According to some embodiments DFB waveguides with tapered gratings operate with a spectrally narrow single mode at the same predictable single mode for all DFB waveguides with substantially identical specifications.

One approach for providing a single-mode laser is a distributed-feedback (DFB) grating structure in the laser cavity. This approach may be implemented in near-infrared lasers used for fiber-optic communication. A DFB grating may lead to a spectral passband in the laser cavity that may be narrower than the free-spectral range and therefore isolates a single longitudinal mode that can experience significant optical gain. However, in the case of an index-coupled DFB laser, where the grating is formed by a periodic variation in the real part of the waveguide refractive index, there may occur two distinct frequencies at the edges of the passband, corresponding to a pi phase shift of the preferred longitudinal mode that is phase matched to the DFB grating.

A DFB laser with a uniform grating may operate predominately in just one mode, corresponding to one of the two frequencies at the edges of the passband. This may be caused by variability in the exact locations of the waveguide end-facets relative to the grating, which may lead to better phase matching and higher gain for one mode. The grating pitch may be comparable to the laser wavelength and the DFB laser may operate at wavelengths on the order of 1 μm. In some embodiments, the DFB gratings may include a grating pitch that is significantly smaller than 1 μm. These DFB gratings may exhibit no higher diffraction orders and may be relatively efficient. However, because of the small size of the grating pitch, it may be practically difficult to control the exact location of the cleaved or polished end-facets to within the grating pitch. Consequently, DFB lasers may operate predominately in one mode or the other, and sometimes even hop between modes, depending on stochastic differences from one device to the next. In applications that benefit from an exact single-mode laser wavelength, this device-to-device variation may provide various poor results such as reduces fabrication yield which may be reduced by a factor of two. In some embodiments, the reduction of fabrication yield may be higher than a factor of two due to mode hopping.

One solution to the noted issue may be to include a defect in the center longitudinally in the DFB grating, which shifts the phase of each mode in a complementary way such that they have degenerate frequencies. This solution may have beneficial results for near-infrared telecommunication lasers. However, this solution may also lead to a concentration of the longitudinal energy in the laser cavity at the defect, which may lead to unwanted variation in the cavity refractive index and gain, including nonuniform gain saturation (spatial hole burning) at higher laser powers. Thus, even if a DFB laser with a cavity defect operates in a single cavity mode, these index and gain variations may lead to unwanted instability and spectral broadening, which may impact the utility of the laser for applications which benefit from narrow linewidth.

Disclosed herein are monolithic DFB lasers with improved control over wavelength design, improved fabrication yield, and improved laser stability and linewidth. The disclosed technology described herein employs distributed variations in the grating geometry of a DFB laser to achieve single-mode operation. This distributed or tapered grating geometry may be incorporated in index-coupled DFB gratings. By varying the strength of interaction between the grating and the light along the laser waveguide, a laser can be designed with just one low-loss longitudinal field profile, corresponding to a single laser frequency. The longitudinal mode frequency may be unaffected by the exact position of the waveguide end-facets.

Furthermore, since the longitudinal electric field may be determined by distributed variations, energy may not be concentrated at a localized defect, as is the case with the above mentioned shifted DFB lasers with the center defect. Thus, the effects of index variation and gain saturation may be reduced which may lead to less linewidth broadening. This technology may enable the design and fabrication of single-mode semiconductor lasers with higher fabrication yield than uniform-grating DFB lasers and narrower spectral linewidth than shifted DFB lasers with the center defect, particularly at higher relative operating power.

Tapered-grating laser technology may enable design of lasers with a single low-loss mode, in contrast to index-coupled uniform-grating DFB lasers that have distinct allowed modes. This may enable more precise engineering of the exact laser wavelength and eliminates stochastic variability in the fabrication of DFB laser chips. Compared to DFB lasers that operate in a single-mode due to a localized defect, tapered-grating DFB lasers can be designed to have a more even energy distribution in the laser cavity, which may improve stability and allow for narrower laser linewidth.

There are two examples of previous patents, that describe the use of tapered-grating structures; however, the technology described herein is distinct from those implementations. U.S. Pat. No. 7,738,523 to Hatori, et al. describes variations in grating profile in order to suppress higher-order lateral (transverse) modes in a laser waveguide that is not intrinsically narrow enough to support only one spatial mode. In this case, the grating profile is not explicitly controlling the longitudinal mode spectrum or the longitudinal energy distribution in the laser cavity. Rather, the intention of the design is to support single-lateral-mode operation while avoiding narrow waveguides that have in this case, the undesired quality of high electrical resistance. In the present disclosure, the waveguide may intrinsically be single lateral-mode due to its narrow width, and the intention of the variation in grating profile is to eliminate the distinct passband frequencies that occur in index-coupled DFB lasers while also tailoring the longitudinal energy distribution in the laser cavity to promote narrow-linewidth operation.

U.S. Pat. No. 9,933,554 to Santis, et al., employs a similar tapered-grating approach to the present disclosure for a similar purpose: to allow only one longitudinal mode in a configuration that supports stable narrow-linewidth laser operation. However, this patent describes a hybrid approach, where a laser structure is bonded to a passive waveguide cavity with a tapered-grating design. In our technology, the tapered-grating design is integrated directly with the laser gain structure itself, which may benefit from a unique sidewall grating design and fabrication process.

Embodiments of Single Mode DFB Lasers

FIG. 1 illustrates an exemplary single mode DFB laser 100 with a single mode DFB waveguide 102. The single mode DFB waveguide 102 includes a semiconductor active region 112 with semiconductor layers above and below the active region 112. The semiconductor active region 112 may be a quantum cascade active region or a quantum well active region. The single mode DFB waveguide 102 includes grating structures 104 in one or both of the sidewalls 105. The grating structures 104 may be tapered gratings as further illustrated and described in FIGS. 4 to 6. The grating structures 104 may force the single mode DFB waveguide 102 to operating in a predictable single frequency mode which may have many beneficial results.

The layers resulting in optical confinement (waveguiding) and optical gain are positioned on a semiconductor substrate 114. In some embodiments, the gain layers are composed of semiconductor quantum wells. In some embodiments, the gain layers are composed of a quantum cascade stack. A dielectric layer 110 is positioned on a surface of the semiconductor substrate 114 and positioned conformally on the grating structures 104. A metal layer 106 is positioned on a portion of the top surface 102a of the semiconductor cap 102 and conformally positioned on the dielectric layer 110.

In some embodiments, the semiconductor substrate and semiconductor cap may include the same semiconductor material. In some embodiments, the semiconductor substrate and semiconductor cap may include a compound semiconductor material. The semiconductor substrate and semiconductor cap may be InP. In some embodiments, the semiconductor active region 112 may be composed of InGaAs quantum wells with AlInAs barriers. The semiconductor active region 112 may create a quantum well structure that provides both optical gain and vertical waveguide confinement.

In some embodiments, the dielectric barrier material may be a nitride layer (e.g. aluminum nitride or silicon nitride) or an oxide layer (e.g. silicon oxide or yttrium oxide). In some embodiments, the metal layer may be a high conductivity material such as gold. The semiconductor substrate may include a backside contact 202 which may be used in conjunction with the metal layer 106 to generate a current through the single mode DFB waveguide 102.

Figure 2:
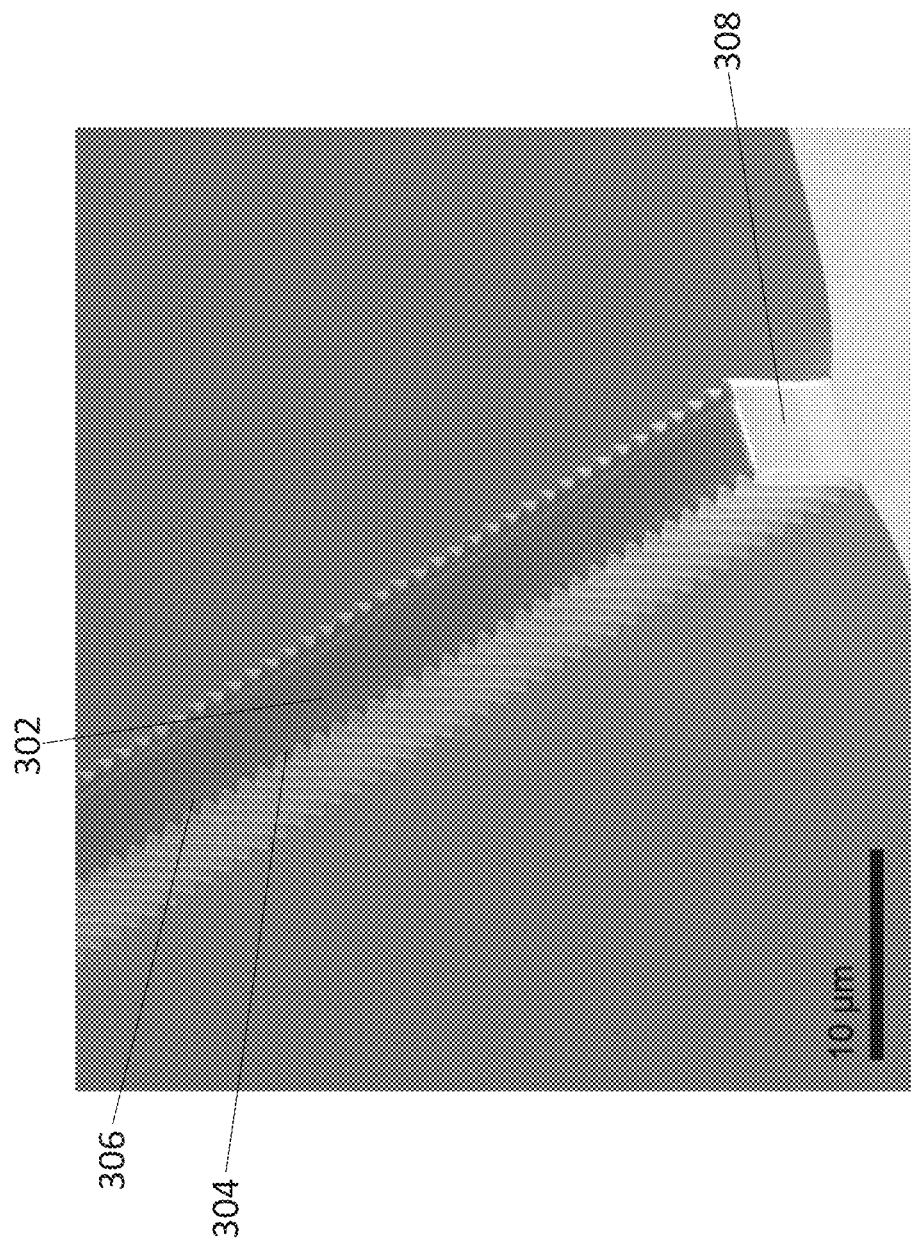
FIG. 2 provides an image of an example single mode DFB waveguide with uniform grating.

FIG. 2 illustrates an exemplary single mode DFB waveguide 302 prior to deposition of a sidewall dielectric barrier or metal top contact. The single mode DFB waveguide 302 may include a semiconductor active region and a semiconductor cap which make up the waveguide. The waveguide may include a grating structure 304 in one or both of the sidewalls 306. The grating structure 304 may force the single mode DFB waveguide 302 to operate at a predictable single frequency mode. As illustrated, the grating structure 304 of the single mode DFB waveguide 302 is uniform throughout the waveguide 302. However, this uniform grating structure 304 includes disadvantageous features. For example, while the waveguide 302 may be confined to a single mode operation this single mode operation depends on the positioning of the end surface 308 or end-facet of the waveguide 302. The end surface 308 of the waveguide 302 is typically produced through cleaving in order to terminate the waveguide 302. However, cleaving may produce a termination at either a maximum width position (at a crest of the end grating structure 304) of the end of the waveguide or a minimum width position (at a trough of the grating structure 304) of the end of the waveguide 302. Depending on where the cleaving occurs, the waveguide 302 may exhibit two distinct longitudinal modes. A typical grating pitch may be 1.2 µm, which may be designed for operation near a free-space wavelength of 7.4 µm. Cleaving in order to ensure that the termination of the waveguide 302 occurs at either a crest or a trough of the grating structure 304 at such small dimensions may be difficult.

Figure 3A:
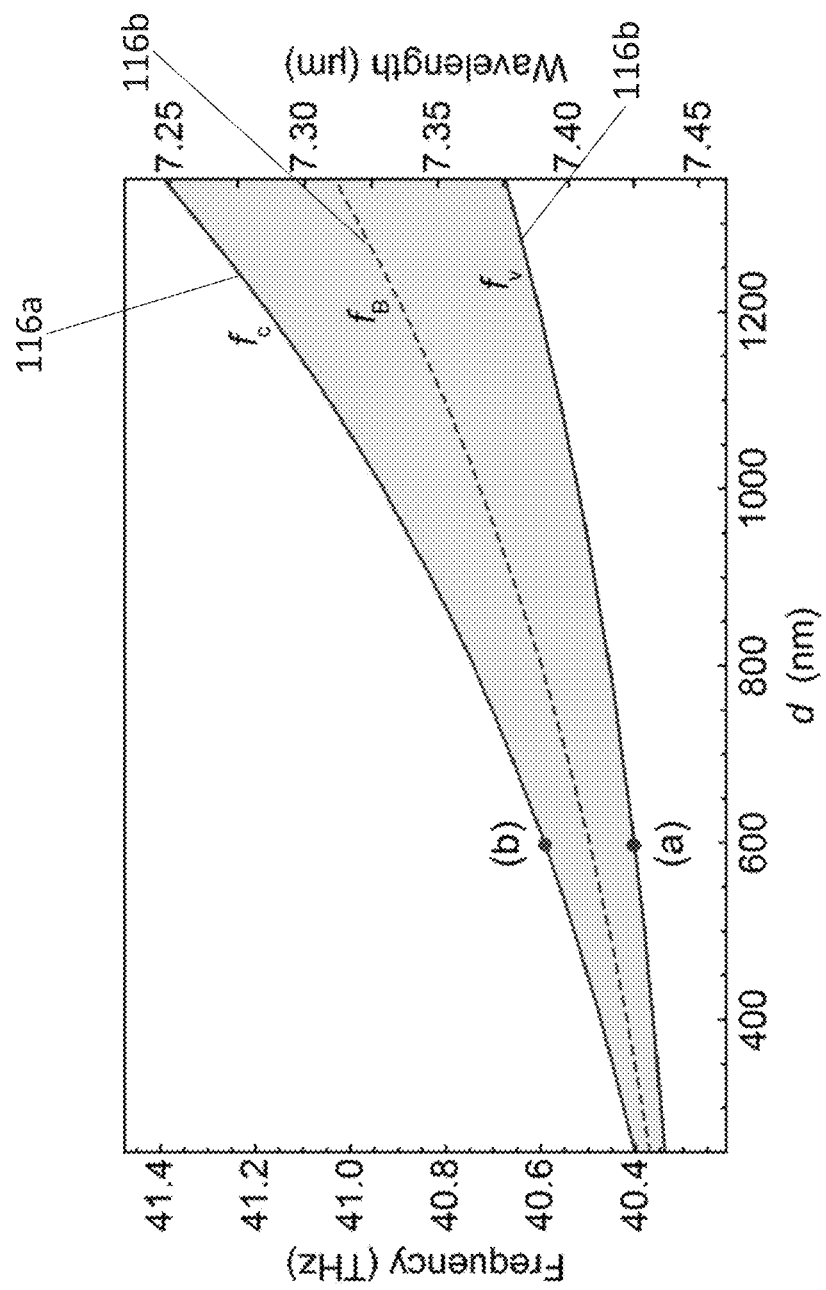
FIG. 3A is a graph illustrating performance of the example single mode DFB laser of FIG. 1.

FIG. 3A also includes a graph which demonstrates an example of two distinct longitudinal modes between an example single mode DFB waveguide based on the different termination positions discussed above. A first line 116a illustrates one operational mode whereas a second line 116b illustrates another distinct longitudinal mode. As illustrated, these longitudinal modes 116a,116b operate at different frequencies and define the edges of the grating passband. A third line 116c illustrates the average of these longitudinal modes 116a,116b which represents a Bragg frequency. The passband frequencies are illustrated to depend on the grating structure depth, d.

Figure 3B:
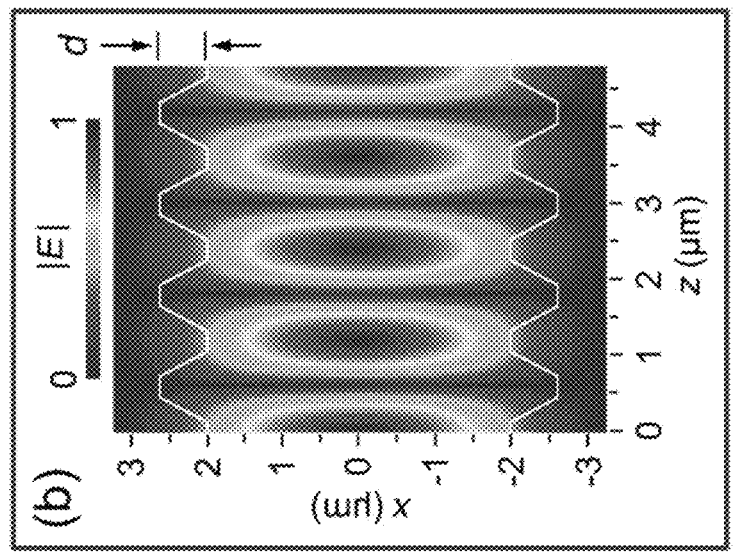
FIGS. 3B and 3C provides various example operational simulations for an example single mode DFB waveguide with uniform grating.
Figure 3C:
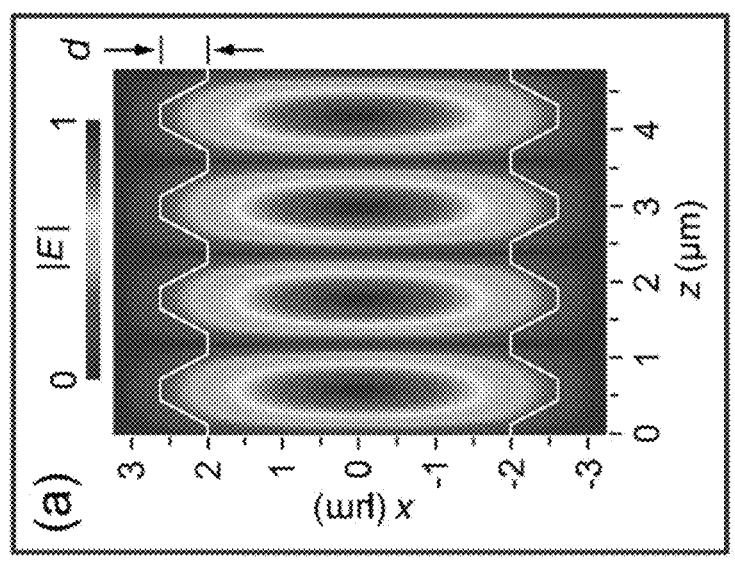

FIGS. 3B and 3C illustrate the two distinct operational modes corresponding to passband frequencies illustrated as 116b and 116a respectively. FIG. 3B illustrates the case where the passband frequency occurs at the crest of the grating structures whereas FIG. 3C illustrates the case where the passband frequency occurs at the trough of the grating structures. As described above, these operational modes may occur depending on the termination position of the waveguide structure which may be difficult to control during manufacturing.

U.S. Pat. No. 9,991,677 entitled "INDEX COUPLED DISTRIBUTED-FEEDBACK SEMICONDUCTOR QUANTUM CASCADE LASERS FABRICATED WITHOUT EPITAXIAL REGROWTH" includes various other single mode DFB laser designs and fabrication methods that are within the spirit of this disclosure and is hereby incorporated by reference into this disclosure. For example, U.S. Pat. No. 9,991,677 describes fabrication of waveguide structures using electron-beam lithography and/or plasma etching which may be used to fabricate the waveguide structures in the present disclosure. Further, dielectric barrier layers and metal electrical contacts were fabricated after producing the waveguide structures. The completed single mode DFB lasers may be cleaved to form reflective or partially reflective end-facets.

Embodiments of Tapered Grating Single Mode DFB Waveguides

Figure 4:
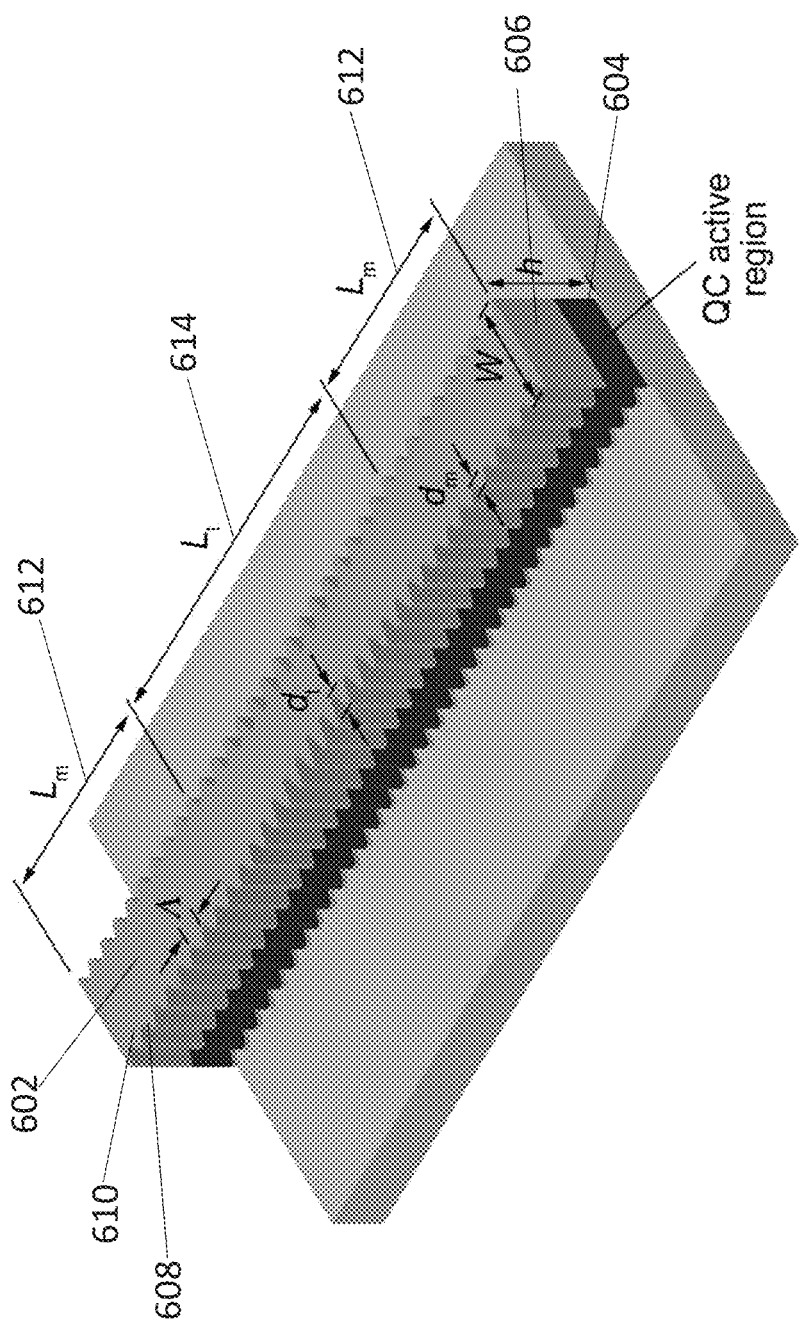
FIG. 4 provides a schematic for a single mode DFB waveguide with a tapered grating structure according to embodiments.

FIG. 4 illustrates an embodiment of a tapered grating single mode DFB waveguide 602. As illustrated, the tapered grating single mode DFB waveguide 602 includes a semiconductor active region 604 and a semiconductor cap 606 which make up the waveguide. A grating structure 608 protrudes horizontally out of a sidewall 610 of the waveguide. The grating structure 608 includes a tapered grating portion 614 sandwiched between two uniform grating portions 612. The uniform grating portions 612 include a plurality of uniform ridges with approximately identical height which laterally protrude from the sidewall 610 of the waveguide. Whereas, the tapered grating portion 614 includes a plurality of tapered ridges which gradually increase in height from one end of the tapered grating portion 614 to an apex ridge. From the apex ridge to the other end of the tapered grating portion 614, the height of the ridges gradually decreases. In some embodiments, the height of the ridges in the tapered grating portion 614 may be quadratically varied. The quadratically varied height of the ridges may cause a corresponding quadratic variation in the grating coupling strength.

In some embodiments, each of the plurality of uniform ridges in the uniform grating portions 612 may include a depth of approximately 400 nm to 600 nm. In some embodiments, the depth of the apex ridge of the plurality of tapered ridges has a depth of about 800 nm to 1000 nm. The depth of the end ridges of the plurality of tapered ridges may be approximately equal to the depth of the uniform ridges. In some embodiments, the uniform grating portions and the tapered grating portion may include approximately uniform grating periods between the sections. The quantum cascade stack may have a thickness of about 6 µm to 6.4 µm. In some embodiments, the quantum cascade stack may have a lateral width of about 5 µm to 5.4 µm at the widest portion of one of the uniform grating portions (e.g. at a crest of the last ridge of the uniform portion).

As illustrated in FIG. 4, the tapered grating single mode DFB waveguide 602 may include an opposing sidewall which includes a grating structure that mirrors the grating structure 608 of the sidewall 610. The tapered grating single mode DFB waveguide 602 may include two mirrored surfaces adjacent to the sidewall 610 including the grating structure 608. The width of one or both of the mirrored surfaces may be approximately the maximum width of the waveguide within one of the uniform grating portions 612 or may be approximately the minimum width of the waveguide within one or both of uniform grating portions 612. As discussed previously, single mode DFB waveguides are typically produced by cleaving the end of the waveguide. However, due to the small periods of these gratings, it may be difficult to accurately cleave the waveguide at an identical location each time. Thus, the mirrored surfaces may occur at a crest or a trough of the single mode DFB waveguides which may influence the produced single frequency mode in a uniform grating single mode DFB waveguide. Advantageously, including the tapered grating portion 614, as illustrated in FIG. 4, locks the single frequency mode in an intermediate frequency from the two frequency modes that typically arise in a single mode DFB waveguide with a completely uniform grating portion. This intermediate frequency is independent of changes in the positioning of the end-facet of the waveguide. The tapered grating single mode DFB waveguide 602 illustrated in FIG. 4 may be implemented in the single mode DFB laser 100 illustrated in FIG. 1.

Figure 5A:
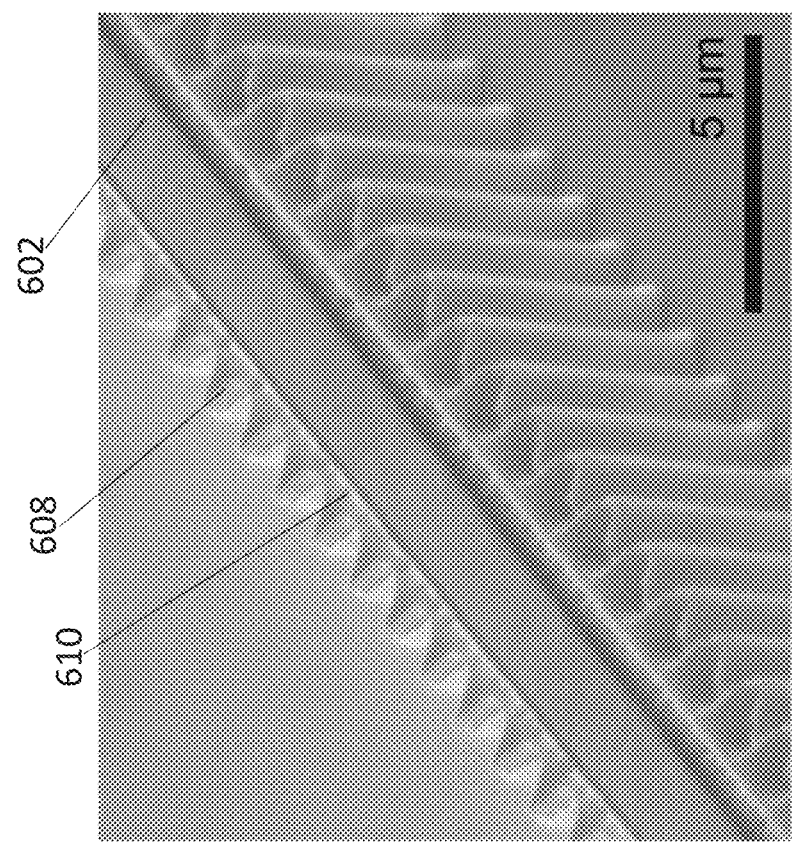
FIGS. 5A and 5B are various perspective view scanning electron microscope (SEM) images of a single mode DFB waveguide with a tapered grating structure according to embodiments.
Figure 5B:
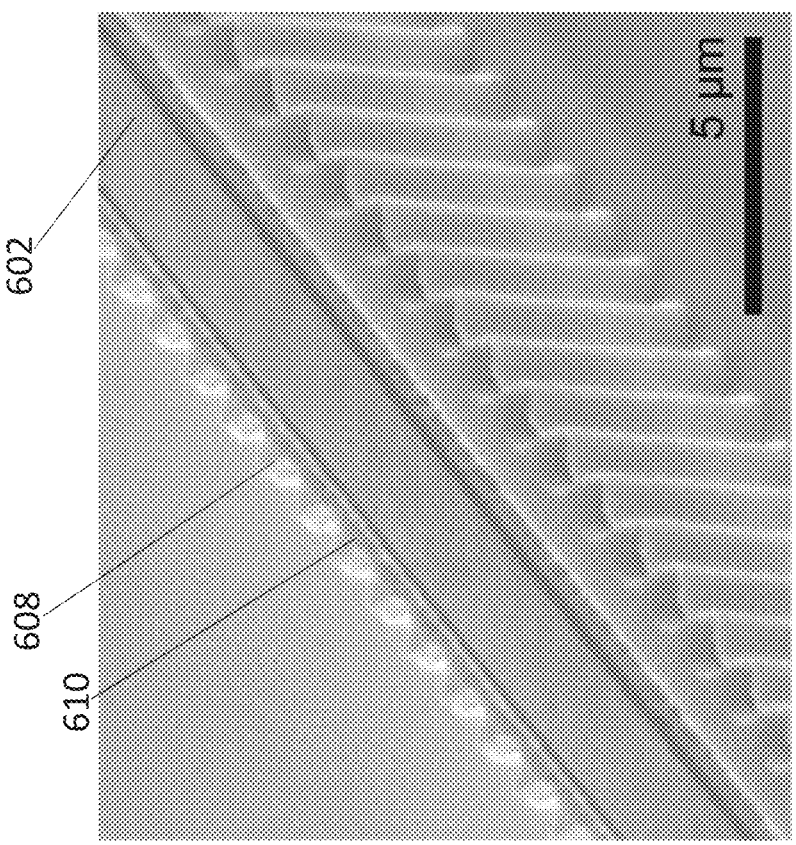

FIGS. 5A and 5B illustrate various perspective view scattering electron microscope (SEM) images of a fabricated tapered grating single mode DFB waveguide 602. FIGS. 6A and 6B share various identically numbered features with the tapered grating single mode DFB waveguide 602 described in connection with FIG. 4. These descriptions will not be repeated.

FIGS. 6A and 6B illustrate various cross sectional SEM images of fabricated single mode lasers including a tapered mode single mode waveguide 602. FIGS. 6A and 6B share various identically numbered features with the tapered grating single mode DFB waveguide 602 described in connection with FIG. 4 and the single mode lasers described in connection with FIG. 1. These descriptions will not be repeated.

Figure 7:
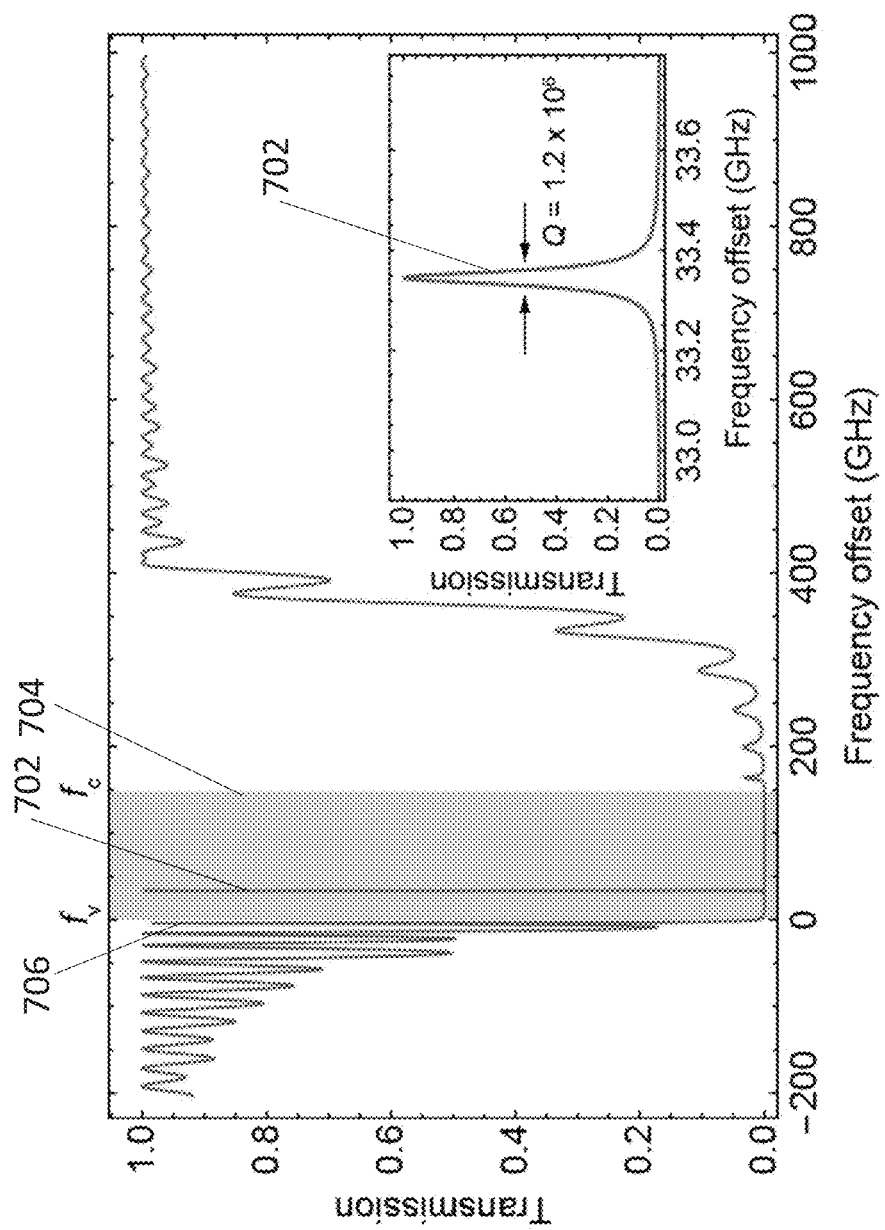
FIG. 7 provides a graph illustrating operation of a tapered grating single mode DFB waveguide according to embodiments.

FIG. 7 is a graph which operationally illustrates an exemplary transmission vs. frequency offset of a tapered grating single mode DFB waveguide such as the tapered grating single mode DFB waveguide 602 disclosed in connection with FIGS. 4-6. The frequency offset is referenced to the lower mirror-section passband frequency, $f_v$. In some instances, $f_v$ may be 40.4 THz. A first peak 702 corresponds the intermediate mode of the tapered grating single mode DFB waveguide. The shaded region corresponds to the passband of the waveguide. Comparatively, a single mode DFB waveguide with a completely uniform grating portion would include two frequency modes which arise at or near the edges 704/706 of the passband. However, due to the tapered grating portion 614, only the intermediate mode which corresponds to the first peak 702 appears. Further the inset graph shows the first peak 702 is an exceedingly spectrally narrow peak with a large quality factor (e.g. $1.2 \times 10^6$). Without being bound to any particular theory, the longitudinal envelope of the electric field is confined in the central section of the waveguide and decays exponentially into the mirror sections, which makes the central frequency of the transmission peak within the laser cavity insensitive to the exact positions of the waveguide end-facet positioning. Furthermore, in contrast to other single mode DFB lasers with a localized cavity defect, the longitudinal field distribution, and consequently the optical power profile in the cavity, may be more evenly distributed within the central waveguide section and can be adjusted by tailoring the grating geometry.

Tapered grating structures provide for single mode DFB waveguides with predictable single mode operation. Uniform grating structures may provide for single mode operation, however DFB waveguides implementing uniform grating structures may operate at one of two single modes. Advantageously, DFB waveguides with tapered gratings operate with a spectrally narrow single mode at the same predictable single mode for all DFB waveguides with substantially identical specifications independent of positioning of the end-facets of the waveguide. Such predictability may lead to increased yield during manufacture of DFB waveguides with tapered gratings. In some embodiments, the yield may increase by 50% or more because typically when manufacturing single mode DFB waveguides, the resultant frequency mode may vary depending on the cleave position as described previously. It will be understood that the cleave position is unpredictable when manufacturing structures with small dimensions.

Example Operational Embodiments

FIGS. 8A-8D illustrate various graphs depicting various operational performances of example embodiments of tapered grating single mode DFB lasers employing a tapered grating single mode DFB waveguide such as the tapered grating single mode DFB waveguide 602 illustrated in FIGS. 4-6. The tapered grating single mode DFB laser employs a 2 mm long tapered grating single mode DFB waveguide.

Figure 8B:
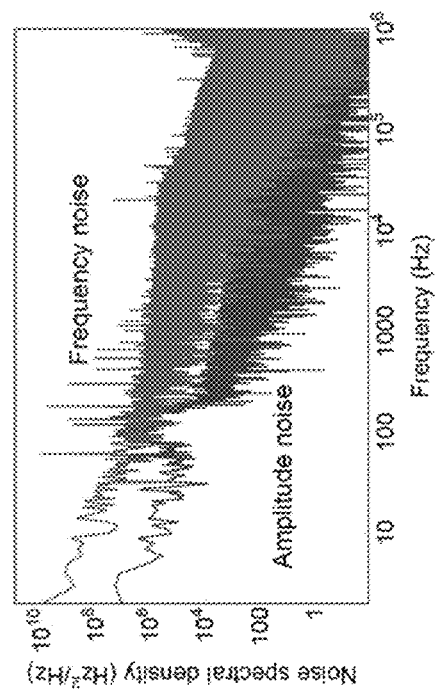
FIGS. 8A to 8D provide various graphs illustrating operation of a tapered grating single mode waveguide according to embodiments.
Figure 8A:
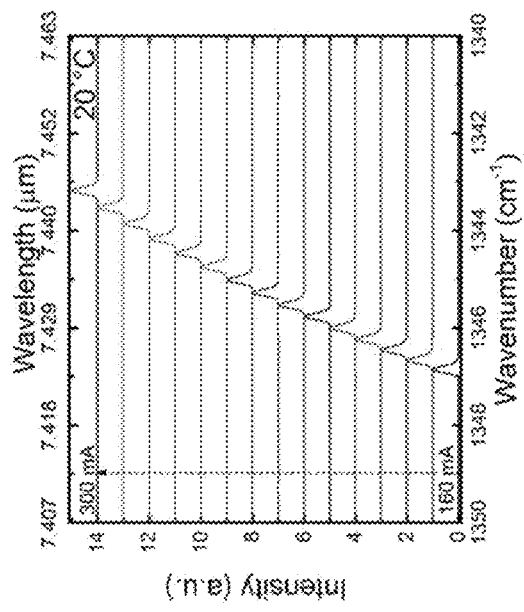

FIG. 8A illustrates measured light output and compliance voltage as a function of injected current. FIG. 8B illustrates a normalized emission spectrum. Advantageously, as illustrated, there was no frequency hoping for the various currents tested. Single mode DFB waveguides implementing uniform gratings have also been shown to mode hop between different single frequency modes at different operating currents which may lead to unpredictable operation.

Figure 8D:
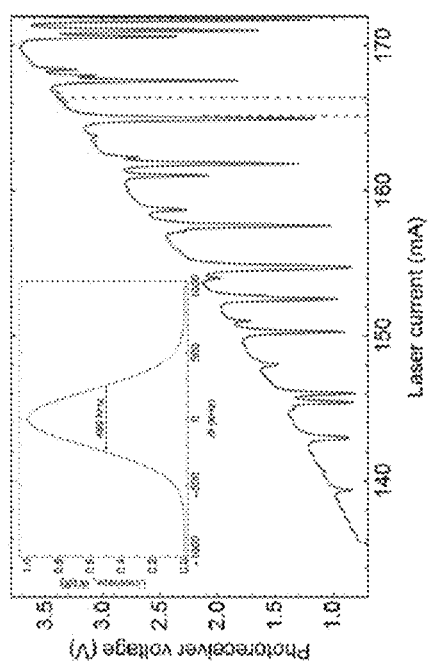
Figure 8C:
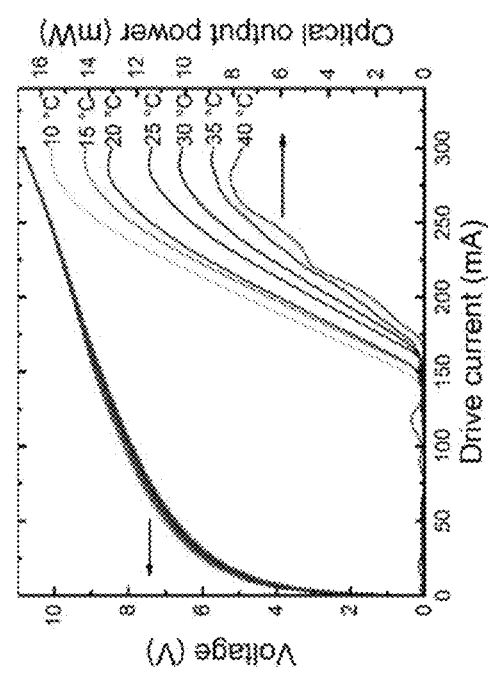

FIG. 8C illustrates measured transmission of light of the tapered grating single mode DFB laser through a 2 cm gas cell filled with lower-pressure $SO_2$. The laser may be current tuned to both the side of a distinct $SO_2$ absorption line (vertical dashed line on the right) and to a spectral position free of $SO_2$ absorption (vertical dashed line on the left). FIG. 8D illustrates the corresponding amplitude noise spectral densities for the laser operated at currents corresponding to the distinct $SO_2$ absorption line (bottom line) and the spectral position free of $SO_2$ absorption (top line) which were measured over a period of 1 second. The excess noise when the laser is tuned to the side of the $SO_2$ absorption line may be due to frequency fluctuations that are translated into amplitude fluctuations by the slope of the absorption line edge. The inset graph in FIG. 8C illustrates a laser lineshape function extracted from the full noise spectrum. The illustrated laser linewidth may be 490 kHz.

Doctrine of Equivalents

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:
1. A single mode distributed-feedback (DFB) waveguide comprising:
 a semiconductor active region; and
 a semiconductor cap stacked on top of the semiconductor active region, wherein semiconductor active region and semiconductor cap form a waveguide, wherein the waveguide includes a grating structure distributed along a sidewall of the waveguide, wherein the grating structure protrudes horizontally out of a side of the waveguide, wherein the grating structure comprises a tapered grating portion sandwiched between two uniform grating portions, wherein each of the uniform grating portions comprise a plurality of uniform ridges with approximately identical height which laterally protrude from the waveguide, and wherein the tapered grating portion comprises a plurality of tapered ridges which gradually increase in height from one end to an apex ridge and gradually decrease in height from the apex to the other end.

2. The single mode DFB waveguide of claim 1, wherein each of the plurality of uniform ridges comprises a depth of approximately 400 nm to 600 nm.

3. The single mode DFB waveguide of claim 1, wherein the depth of an apex ridge of the plurality of tapered ridges has a depth of about 800 nm to 1000 nm.

4. The single mode DFB waveguide of claim 3, wherein the depth of ridge at the ends of the plurality of tapered ridges equals the depth of the uniform ridges.

5. The single mode DFB waveguide of claim 1, wherein the uniform grating portions and the tapered grating portion comprises an approximately uniform grating period between the sections.

6. The single mode DFB waveguide of claim 1, wherein the waveguide has a thickness of about 6 μm to 6.4 μm.

7. The single mode DFB waveguide of claim 1, wherein the waveguide has a lateral width of about 5 μm to 5.4 μm at the widest portion of one of the uniform grating portions.

8. The single mode DFB waveguide of claim 1, wherein the waveguide comprises another grating structure on an opposing sidewall to the sidewall which mirrors the grating structure.

9. The single mode DFB waveguide of claim 1, wherein the waveguide comprises a surface adjacent to the sidewall including the grating structure comprising a mirrored surface, wherein the width of the mirrored surface is positioned at approximately the maximum width of the quantum cascade stack within the uniform grating portion or is positioned at approximately the minimum width of the waveguide within one of the uniform grating portions.

10. The single mode DFB waveguide of claim 9, wherein the mirrored surface is positioned at the lowest depth portion of the grating structure within one of the uniform grating portions or is positioned at the highest depth portion of the grating structure within one of the uniform grating portions.

11. The single mode DFB waveguide of claim 1, wherein the waveguide comprises a quantum well structure.

12. The single mode DFB waveguide of claim 1, wherein a surface adjacent to the sidewall including the grating structure comprises a first mirrored surface and wherein another surface adjacent to the sidewall including the grating structure and opposite to the first mirrored surface comprises a second mirrored surface.

13. The single mode DFB waveguide of claim 1, wherein each ridge within the grating structure comprise gradually increasing followed by gradually decreasing depth portions.

14. The single mode DFB waveguide of claim 1, wherein the semiconductor active region comprises InGaAs quantum wells and AlInAs barriers.

15. The single mode DFB waveguide of claim 1, wherein the ridges and a body portion of the waveguide share a substantially uniform thickness.

16. A single mode DFB laser comprising:
a semiconductor substrate;
the single mode DFB waveguide of claim 1 on the semiconductor substrate;
a dielectric layer positioned on a surface of the semiconductor substrate and positioned conformally on the grating structure;
a metal layer contacting a portion of a top surface of the semiconductor cap.

17. The single mode DFB laser of claim 16, wherein the semiconductor cap and the semiconductor substrate comprise a same semiconductor material.

18. The single mode DFB laser of claim 17, wherein the semiconductor cap and the semiconductor substrate further comprise an n-type or p-type semiconductor material.

19. The single mode DFB laser of claim 18, wherein the semiconductor cap and the semiconductor substrate further comprise a compound semiconductor material.

* * * * *